United States Patent
Kwon et al.

(10) Patent No.: US 9,601,694 B2
(45) Date of Patent: Mar. 21, 2017

(54) DONOR SUBSTRATE AND METHOD FOR MANUFACTURING ORGANIC LIGHT EMITTING DIODE DISPLAY

(71) Applicant: Samsung Display Co., Ltd., Yongin, Gyeonggi-Do (KR)

(72) Inventors: Ji-Young Kwon, Yongin (KR); Ji-Hwan Yoon, Yongin (KR); Sang-Woo Pyo, Yongin (KR); Ha-Jin Song, Yongin (KR); Byeong-Wook Yoo, Yongin (KR); Bum-Suk Lee, Yongin (KR); Ji-Myoung Ye, Yongin (KR); Yi-Seul Kim, Yongin (KR)

(73) Assignee: SAMSUNG DISPLAY CO., LTD, Gyeonggi-do (KR)

( * ) Notice: Subject to any disclaimer, the term of this patent is extended or adjusted under 35 U.S.C. 154(b) by 16 days.

(21) Appl. No.: 14/133,210

(22) Filed: Dec. 18, 2013

(65) Prior Publication Data
US 2015/0014642 A1 Jan. 15, 2015

(30) Foreign Application Priority Data
Jul. 12, 2013 (KR) ........................ 10-2013-0082379

(51) Int. Cl.
H01L 33/02 (2010.01)
H01L 51/00 (2006.01)

(52) U.S. Cl.
CPC ........ *H01L 51/0013* (2013.01); *Y02E 10/549* (2013.01); *Y02P 70/521* (2015.11)

(58) Field of Classification Search
None
See application file for complete search history.

(56) References Cited

U.S. PATENT DOCUMENTS

| | | | |
|---|---|---|---|
| 2001/0033992 A1* | 10/2001 | Kita ..................... | B41C 1/1016 430/273.1 |
| 2002/0149315 A1* | 10/2002 | Blanchet-Fincher ......... | 313/504 |
| 2003/0008224 A1* | 1/2003 | Fujita et al. ................... | 430/17 |
| 2003/0035935 A1* | 2/2003 | Wachi ............... | B41M 5/38214 428/195.1 |
| 2003/0124265 A1* | 7/2003 | Bellmann et al. ........... | 427/536 |
| 2004/0041898 A1* | 3/2004 | Nakamura .............. | B41J 2/325 347/172 |
| 2004/0046858 A1* | 3/2004 | Yoshinari ................ | B41J 2/325 347/213 |
| 2004/0053157 A1* | 3/2004 | Yoshinari .............. | B41M 5/345 430/203 |

(Continued)

FOREIGN PATENT DOCUMENTS

| | | |
|---|---|---|
| KR | 1020070068283 A | 6/2007 |
| KR | 1020080004120 A | 1/2008 |
| KR | 101009644 B1 | 1/2011 |

OTHER PUBLICATIONS

Li, X, et al, "Large-Area Synthesis of High-Quality and Uniform Graphene Films on Copper Foils", Science, Jun. 5, 2009, vol. 324, pp. 1312-1314.

*Primary Examiner* — Abul Kalam
(74) *Attorney, Agent, or Firm* — Cantor Colburn LLP

(57) ABSTRACT

A donor substrate for a laser transfer includes a base layer, a primer layer disposed on the base layer, a light-to-heat conversion layer disposed on the primer layer, and an intermediate layer disposed on the light-to-heat conversion layer, where the light-to-heat conversion layer includes graphene.

8 Claims, 6 Drawing Sheets

(56) References Cited

U.S. PATENT DOCUMENTS

| | | | |
|---|---|---|---|
| 2004/0115556 A1* | 6/2004 | Nakamura | B41M 5/465 430/200 |
| 2004/0188614 A1* | 9/2004 | Nakamura | B41M 5/38214 250/318 |
| 2004/0241355 A1* | 12/2004 | Yoshinari | B41C 1/1091 428/32.87 |
| 2005/0116621 A1* | 6/2005 | Bellmann et al. | 313/503 |
| 2005/0118362 A1* | 6/2005 | Kim | B41M 5/46 428/32.81 |
| 2005/0118525 A1* | 6/2005 | Kim | H01L 51/0013 430/200 |
| 2006/0044387 A1* | 3/2006 | Kim et al. | 347/262 |
| 2006/0046181 A1* | 3/2006 | Kim et al. | 430/199 |
| 2006/0046182 A1* | 3/2006 | Song et al. | 430/199 |
| 2006/0046333 A1* | 3/2006 | Kim et al. | 438/29 |
| 2006/0068520 A1* | 3/2006 | Song et al. | 438/99 |
| 2013/0065045 A1* | 3/2013 | Gervasi et al. | 428/327 |
| 2013/0175550 A1* | 7/2013 | Song et al. | 257/88 |
| 2013/0210218 A1* | 8/2013 | Accardi et al. | 438/478 |
| 2013/0341601 A1* | 12/2013 | Pyo et al. | 257/40 |

* cited by examiner

US 9,601,694 B2

DONOR SUBSTRATE AND METHOD FOR MANUFACTURING ORGANIC LIGHT EMITTING DIODE DISPLAY

This application claims priority to Korean Patent Application No. 10-2013-0082379, filed on Jul. 12, 2013, and all the benefits accruing therefrom under 35 U.S.C. §119, the content of which in its entirety is herein incorporated by reference.

BACKGROUND (a) Field

Exemplary embodiments of the invention relate to a donor substrate and a manufacturing method of an organic light emitting diode ("OLED") display using the donor substrate.

(b) Description of the Related Art

Recently, display devices including OLED display are widely used for the characteristics thereof, e.g., lower energy consumption and high visibility.

In such display devices including OLED display, a method of patterning a color to a light emitting element is typically used to realize full color of the display device using the OLED, and a realization effect of full color may be determined based on a method of providing an organic layer of the OLED display for determining the color of the light emitting element. Methods of providing the organic layer in the OLED typically include a deposition method, an ink-jet method, and a method of laser induced thermal imaging ("LITI"). In the method of LITI, light emitted from a laser is converted into thermal energy and a transfer layer is transferred to the OLED by the converted thermal energy to provide the organic layer in the OLED.

In such a method of LITI, a donor film including the transfer layer is typically used for forming the pattern in a substrate of the light emitting element by converting the light into thermal energy. The donor film may have a structure in which a base film, a light-to-heat conversion layer, and a transfer layer (e.g., a pattern-directing layer) are sequentially deposited. The donor film selectively includes an intermediate layer between the light-to-heat conversion layer and the transfer layer to effectively prevent a material included in the light-to-heat conversion layer from being spread into the transfer layer.

In the method of LITI, when the laser is irradiated to the donor film, the light energy of the laser is converted into thermal energy in the light-to-heat conversion layer and a volume expansion of the light-to-heat conversion layer and the blocking layer is generated by the thermal energy, and thereby the transfer layer is transferred to the substrate of the OLED by the volume expansion.

SUMMARY

Exemplary embodiments of the invention relate to a donor substrate including a light-to-heat conversion layer including graphene to obtain high transmittance of the donor substrate and to efficiently obtain alignment of a transfer pattern in a laser thermal transfer process, and a manufacturing method of an organic light emitting diode ("OLED") display using the donor substrate.

An exemplary embodiment of a donor substrate for a laser transfer according to the invention includes: a base layer; a primer layer disposed on the base layer; a light-to-heat conversion layer disposed on the primer layer; and an intermediate layer disposed on the light-to-heat conversion layer, where the light-to-heat conversion layer includes graphene.

In an exemplary embodiment, light transmittance of the base layer may be greater than 90%.

In an exemplary embodiment, the base layer may include glass, a transparent film, or a polymer film.

In an exemplary embodiment, a thickness of the base layer may be in a range of about 0.025 millimeter (mm) to about 0.15 mm.

In an exemplary embodiment, the graphene may include a graphene sheet.

In an exemplary embodiment, the graphene may include a plurality of graphene pieces, and the light-to-heat conversion layer may further include a dispersion material, in which the graphene pieces are dispersed.

In an exemplary embodiment, the dispersion material may be one of tetrahydrofuran and dichlorobenzene.

In an exemplary embodiment, a thickness of the intermediate layer may be in a range of about 1.0 micrometer ($\mu m$) to 3.0 $\mu m$.

An exemplary embodiment of a manufacturing method of an OLED display according to the invention includes: providing a thin film transistor, a pixel electrode and a hole auxiliary layer on a substrate; preparing a donor substrate which includes a base layer, a primer layer disposed on the base layer, a light-to-heat conversion layer disposed on the primer layer, an intermediate layer disposed on the light-to-heat conversion layer, and an organic emission layer disposed on the intermediate layer; transferring the organic emission layer of the donor substrate on the hole auxiliary layer of the substrate using a laser; removing the donor substrate after the transferring the organic emission layer on the hole auxiliary layer of the substrate; and providing an electron auxiliary layer on the organic emission layer, where the light-to-heat conversion layer includes graphene.

In an exemplary embodiment, the hole auxiliary layer may include a hole injection layer ("HIL") disposed on the pixel electrode, and a hole transport layer ("HTL") disposed on the HIL, and the electron auxiliary layer may include an electron transport layer ("ETL") disposed on the organic emission layer and an electron injection layer ("EIL") disposed on the ETL.

In an exemplary embodiment, the graphene may include a graphene sheet.

In an exemplary embodiment, the graphene may include a plurality of graphene pieces, and the light-to-heat conversion layer may further include a dispersion material in which the graphene pieces are dispersed.

In an exemplary embodiment, the dispersion material may be one of tetrahydrofuran and dichlorobenzene.

In exemplary embodiments, as described herein, the donor substrate has high light transmittance such that the alignment of the transfer patterns may be easily performed in the laser transfer process. In such embodiments, as described above, the light-to-heat conversion layer of the donor substrate including the graphene may have a substantially uniform structure compared to a conventional donor substrate including the carbon black, such that stability of the laser transfer process may be improved, and a defect of the OLED display may be prevented.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
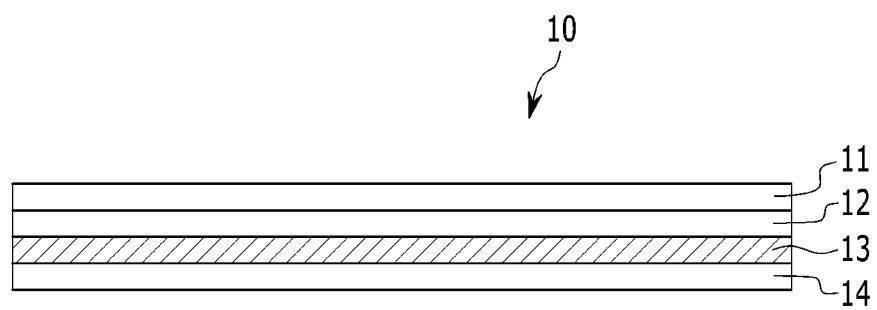
FIG. 1 is a cross-sectional view of an exemplary embodiment of a donor substrate according to the invention.

The invention will be described more fully hereinafter with reference to the accompanying drawings, in which embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer, the element or layer can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in further detail with reference to accompanying drawings.

Firstly, an exemplary embodiment of a method of laser induced thermal imaging (hereinafter, also referred to as "LITI") using a laser will be described as one exemplary embodiment of a method of providing an organic emission layer of an organic light emitting diode ("OLED") display according to the invention.

In an exemplary embodiment of a method of laser induced thermal imaging, a laser beam generated from a laser beam generation device is patterned using a mask pattern, and the patterned laser beam is irradiated on a donor film including a base film and a transfer layer to expand and to transfer a portion of the transfer layer to the OLED display, thereby providing an emission layer in the OLED display. Such an embodiment of a method of laser induced thermal imaging is a dry process, and may allow the emission layer to be substantially precisely patterned.

In such an embodiment, the donor substrate used in the method of laser induced thermal imaging has a structure in which a base layer, a light-to-heat conversion layer and a transfer layer (e.g., a pattern-directing layer) are sequentially disposed on one another. In an exemplary embodiment, the donor substrate used to the method of laser induced thermal imaging may further include an intermediate layer disposed between the light-to-heat conversion layer and the transfer layer to effectively prevent a material included in the light-to-heat conversion layer from being spread into the transfer layer. In such an embodiment, the donor substrate may further include a primer layer disposed between the base layer and the light-to-heat conversion layer to block mechanical or thermal damage from the laser.

A conventional light-to-heat conversion layer typically includes carbon black, and the light-to-heat conversion layer may have an opaque characteristic due to the carbon black such that an alignment thereof with a substrate disposed thereunder in the laser transfer process.

In such a conventional light-to-heat conversion layer including the carbon black, it is difficult to uniformly disperse the carbon black such that it is difficult to form a uniform donor substrate and to obtain stability of the laser transfer process, thereby generating a defect in the OLED display.

Hereinafter, an exemplary embodiment of the donor substrate will be described in detail with reference to FIG. 1.

FIG. 1 is a cross-sectional view of an exemplary embodiment of a donor substrate according to the invention.

In an exemplary embodiment, as shown in FIG. 1, a donor substrate 10 includes a base layer 11, a primer layer 12, a light-to-heat conversion layer 13 and an intermediate layer 14, which are sequentially disposed on one another. In such an embodiment, the primer layer 12 may be disposed on the base layer 11, the light-to-heat conversion layer 13 may be disposed on the primer layer 12, and the intermediate layer 14 may be disposed on the light-to-heat conversion layer 13.

Hereafter, each of the base layer 11, the primer layer 12, the light-to-heat conversion layer 13 and the intermediate layer 14 will be described in greater detail.

In an exemplary embodiment, the base layer 11 may include glass, a transparent film, or a polymer film. In an exemplary embodiment, where the base layer 11 includes the polymer film, the polymer film may include polyester, polycarbonate, polyolefin, or polyvinyl resin, for example, but is not limited thereto. In one exemplary embodiment, for example, the polymer film may include polyethylene terephthalate or polyethylene naphthalate that have high processability, high thermal stability and high light transmittance. In an exemplary embodiment, the base layer 11 may include a material having light transmittance equal to or greater than about 90%.

In an exemplary embodiment, the surface of the base layer 11 may be surface-treated and reformed by, for example, corona treatment, plasma treatment or the like, the details of which can be determined by one of skill in the art without undue experimentation, such that the adhesive property and a surface tension may be controlled for following processes.

In an exemplary embodiment, the base layer 11 may further include a particle. In such an embodiment, the particle may be a particle positioned and condensed inside and outside the base layer 11, a gel component or a particle including a material different from a material of the base layer. In such an embodiment, a size of the particle is less than about 1 micrometer ($\mu$m), such that scattering and diffraction by the particle or the gel component in the transfer process using the laser is effectively prevented from occurring, and energy of the laser is thereby effectively transmitted to a predetermined portion for the transferring.

In an exemplary embodiment, a thickness of the base layer 11 may be in a range of about 0.025 millimeter (mm) to about 0.15 mm. In one exemplary embodiment, for example, the thickness of the base layer 11 is in a range of about 0.05 mm to about 0.1 mm, but is not limited thereto.

In an exemplary embodiment, the primer layer 12 controls temperature transmittance between the base layer 11 and adjacent layers, improves adhesiveness between the base layer 11 and the adjacent layers, and controls image formation radiation transmittance to the light-to-heat conversion layer 13. In such an embodiment, the primer layer 12 may effectively prevent the base layer 11 and the light-to-heat conversion layer 13 from being separated in the transfer process using the laser. In an exemplary embodiment, the primer layer 12 may include an acryl-based resin, a polyurethane-based resin, a polyester-based resin, or a combination thereof. When heat resistance adhesive force between the primer layer 12 and the base layer 11 or between the primer layer 12 and the light-to-heat conversion layer 13 is deteriorated, the base layer 11 and the light-to-heat conversion layer 13 may be separated in the transfer process using the laser.

In an exemplary embodiment, the light-to-heat conversion layer 13, which absorbs light (e.g., infrared light or visible light) and converts a portion of the light into heat, includes a resin composition including a thermosetting resin and a light-to-hear conversion material.

In such an embodiment, the resin composition may include the thermosetting resin or a combination of the thermosetting resin and a thermoplastic resin. In an exemplary embodiment, where the resin composition of the light-to-heat conversion layer 13 includes the combination of the thermosetting resin and the thermoplastic resin, the thermosetting resin includes a hardener, a content of which may be in more than about 50 weight percent (wt %) based on a total weight of the resin composition. If the content of the hardener is less than about 50 wt %, solvent resistance is decreased such that a solvent of the intermediate layer may penetrate into the light-to-heat conversion layer 13 when coating the intermediate layer, and the dispersion may not be substantially smooth in the dispersion process of the light-to-heat conversion material such that a pinhole may be generated in the coating process.

In an exemplary embodiment, a content of the light-to-heat conversion material is in a range of about 25 wt % to about 40 wt % based on a total weight of the light-to-heat conversion layer 13. When the content of the light-to-heat conversion material is less than about 25 wt %, expansion of the light-to-heat conversion layer 13 is limited in the transfer process using the laser such that a predetermined pattern may not be substantially uniformly transferred. When the content of the light-to-heat conversion material is more than about 40 wt %, heat may be excessively generated in the laser transfer process such that the light-to-heat conversion layer 13 may be burned and not transferred.

In an exemplary embodiment, the resin composition includes a polyurethane-based thermosetting resin. In such an embodiment, the thermosetting polyurethane includes a polycarbonate polyurethane, a polyester polyurethane, polyurethane or a combination thereof, for example. In such an embodiment, the polyurethane resin may have a glass transition temperature higher than about 10° C. In such an embodiment, the polyurethane resin may have a glass transition temperature in a range of about 10° C. to about 50° C. When the glass transition temperature of the polyurethane resin is less than about 10° C., a coating layer may be partially transferred into an opposite surface in an aging process after coating the light-to-heat conversion layer 13. When the glass transition temperature is higher than about 50° C., the volume expansion is substantially small in the laser irradiation, such that transferring a predetermined shape may not be effectively preformed.

In an exemplary embodiment, the hardener may include an isocyanate-based hardener, a peroxide, an epoxy-based crosslinker, a metal chelating-based crosslinker, a melamine-based crosslinker, an aziridine-based crosslinker, a metal salt or a combination thereof, for example. In such an embodiment, the hardener may further include the thermoplastic resin.

The thermoplastic resin is in an amount less than a sum of the thermosetting resin and the crosslinker solid based on the total weight of the resin composition. In one exemplary embodiment, for example, the content of the thermoplastic resin is greater than about 50 wt % based on the total weight of the resin composition. The thermoplastic resin may be polyvinylchloride-polyvinyl acetate copolymer or a polyvinylchloride homo-polymer, and the thermoplastic resin has a glass transition temperature higher than about 40° C. If the glass transition temperature is less than about 40° C., a blocking phenomenon may be generated.

In an exemplary embodiment, the light-to-heat conversion layer 13 is manufactured by being coated and dried on a base thereof including the primer layer 12. In such an embodiment, as described above, the light-to-heat conversion layer 13 is a thermosetting type such that a crosslinking treatment is performed with appropriate heating treatment. In an exemplary embodiment, the crosslinking treatment may be performed together with the dry process. In an alternative exemplary embodiment, the crosslinking treatment process may be separately performed after the dry process.

Herein, the light-to-heat conversion material means a material that absorbs incident laser light and converts the light into heat, and generally includes a dye (e.g., a visible ray dye, an ultraviolet ("UV") dye, an infrared dye, fluorescent dye or a radiation polarization dye), a pigment, a metal, a metal compound, a metal film or carbon black. In an exemplary embodiment, the light-to-heat conversion material includes graphene.

In an exemplary embodiment, the graphene, which functions as the light-to-heat conversion material, may have a sheet shape (hereinafter, "graphene sheet"). In such an embodiment, the graphene may be a single graphene sheet. In an alternative exemplary embodiment, the graphene may include a plurality of graphene flakes having a piece shape (hereinafter, "graphene pieces") and the light-to-heat conversion layer 13 may further include a dispersion material in which the graphene pieces are substantially uniformly dispersed.

In an exemplary embodiment, where the light-to-heat conversion layer 13 includes the graphene sheet, the graphene sheet is manufactured to have a single-layered structure or a multi-layered structure through a chemical vapor deposition ("CVD") process. In such an embodiment, an entire surface of the donor substrate is substantially uniform.

In an exemplary embodiment, where the light-to-heat conversion layer 13 includes the graphene pieces, the graphene pieces may be obtained by weakening or removing a combination between graphite layers using a method of oxidizing a graphite to form oxidized graphene pieces and by reducing the oxidized graphene pieces using a reduction method. In an exemplary embodiment, the obtained graphene pieces are dispersed in the dispersion material. In such an embodiment, the dispersion material may be one of tetrahydrofuran and dichlorobenzene, but is not limited thereto.

In such an embodiment, the graphene pieces are easily dispersed in the dispersion material such that a transparent graphene film may be efficiently prepared.

In such an embodiment, where the light-to-heat conversion layer 13 includes the graphene sheet or the graphene pieces dispersed in the dispersion material, light transmittance of the donor substrate 10 may be substantially high such that the alignment of the transfer pattern may be efficiently and effectively performed in the laser transfer process.

In an exemplary embodiment, the light-to-heat conversion layer 13 of the donor substrate 10 including the graphene may have a substantially uniform structure compared to a conventional donor substrate including the carbon black, such that stability of the laser transfer process may be improved, and a defect of the OLED display may be prevented.

In an exemplary embodiment, the intermediate layer 14 is provided to effectively prevent the light-to-heat conversion material in the light-to-heat conversion layer 13 from being transferred when the transfer layer is transferred by the heat generated in the light-to-heat conversion layer 13 and to effectively prevent the transfer layer from being burned by the heat that is generated in the light-to-heat conversion layer 13 when the transfer layer is transmitted to the transfer layer.

In an exemplary embodiment, the intermediate layer 14 has a thickness (e.g., a coating thickness) of about 1.0 μm to about 3.0 μm after the drying. When the thickness of the intermediate layer 14 is less than about 1.0 μm, a heat blocking effect is decreased such that the transfer layer may be burned, and the uniform surface may not be formed such that the surface on which the transfer layer is transferred may become non-uniform, such that the resolution of the display may be decreased. When the thickness is greater than about 3 μm, the heat may be excessively blocked such that the transfer layer may not be effectively transferred.

In such an embodiment, the intermediate layer 14 includes an UV hardening resin and may further include the thermoplastic resin having no adhesive characteristic at room temperature.

In one exemplary embodiment, for example, the UV hardening resin may include a urethane acrylate, an epoxy acrylate, a polyester acrylate, a silicon acrylate, or a combination thereof. In such an embodiment, the thermoplastic resin may be mixed, for example, with a resin such as a polyurethane resin, an acrylate-based resin a polyester resin or a urethane acrylate copolymer to decrease hardness of the UV hardening resin.

Figure 2:
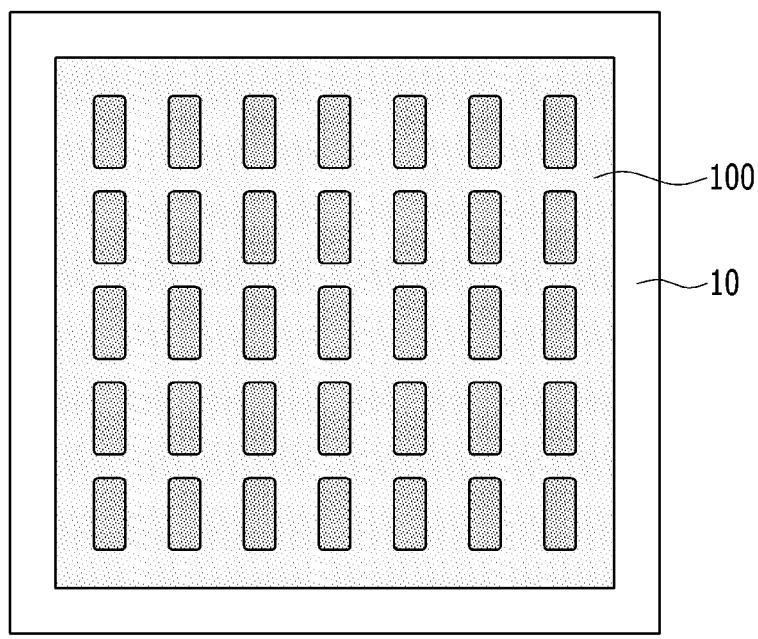
FIG. 2 is a plan view of an exemplary embodiment of a donor substrate disposed on a substrate, according to the invention.

FIG. 2 is a plan view of an exemplary embodiment of a donor substrate 10 disposed on a substrate 100, according to the invention.

Referring to FIG. 2, in a conventional method using the light-to-heat conversion layer including the carbon black, the donor substrate is substantially opaque such that the transfer alignment may not be substantially precisely performed in the laser transfer process, as it may be difficult for the laser to be correctly transmitted to a portion of the donor substrate corresponding to a pixel.

In an exemplary embodiment, the donor substrate 10 may have high light transmittance such that the transfer alignment may be easily performed with improved accuracy in the laser transfer process, such that the laser may be easily and correctly transmitted to a portion of the donor substrate 10 corresponding to a pixel.

Figure 3:
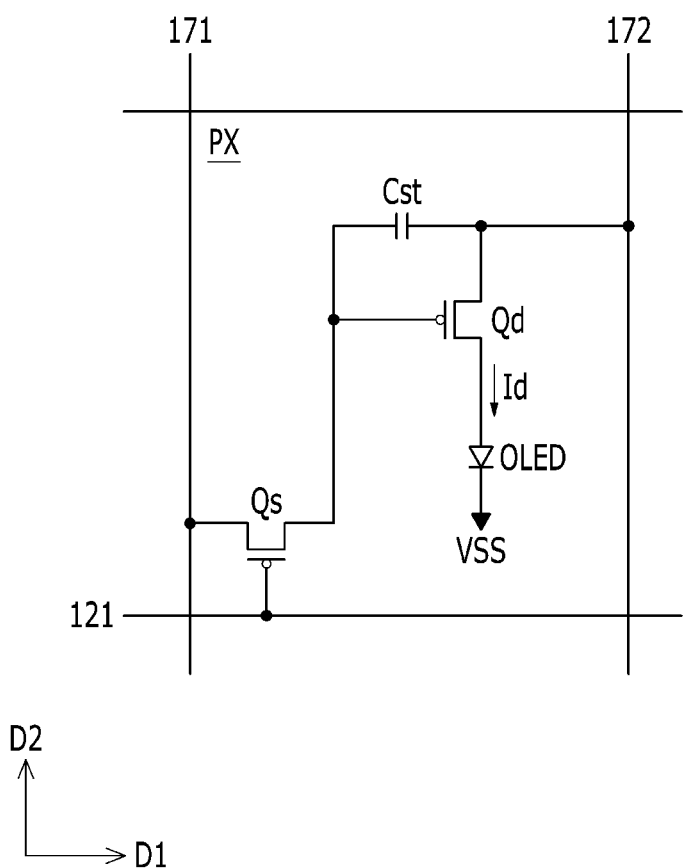
FIG. 3 is an equivalent circuit of a pixel of an exemplary embodiment of an organic light emitting diode ("OLED") display according to the invention.

FIG. 3 is an equivalent circuit of a pixel of an exemplary embodiment of an OLED display manufactured using the donor substrate 10 according to an exemplary embodiment of the invention.

Referring to FIG. 3, an exemplary embodiment of an OLED display according to the invention includes a plurality of signal lines 121, 171 and 172 and a plurality of pixels PX connected thereto. Each of the pixels PX may be one of a red pixel, a green pixel and a blue pixel.

The signal lines include a plurality of scan lines 121 for transmitting scan signals (or gate signals), a plurality of data lines 171 for transmitting data signals, and a plurality of driving voltage lines 172 for transmitting a driving voltage. The scan lines 121 extend substantially parallel to each other in a first direction D1, and the data lines 171 extend substantially parallel to each other in a second direction D2, which is substantially perpendicular to the first direction D1. In an exemplary embodiment, as shown in FIG. 3, the driving voltage lines 172 may extend substantially in the second direction D2, but is not limited thereto. In an alternative exemplary embodiment, the driving voltage lines 172 may extend substantially in the first direction D1 or may have a mesh form.

Each pixel PX includes a switching transistor Qs, a driving transistor Qd, a storage capacitor Cst and an organic light emitting element OLED, and is connected to a corresponding scan line 121, a corresponding data line 171 and a corresponding driving voltage line 172 among the signal lines.

The switching transistor Qs includes a control terminal, an input terminal and an output terminal, and the control terminal of the switching transistor Qs is connected to a corresponding scan signal 121, the input terminal of the switching transistor Qs is connected to the corresponding data line 171, and the output terminal of the switching transistor Qs is connected to the driving transistor Qd. The switching transistor Qs transmits a data signal received from the corresponding data line 171 to the driving transistor Qd in response to a scan signal received from the corresponding scanning signal line 121.

The driving transistor Qd includes a control terminal, an input terminal and an output terminal, and the control terminal of the driving transistor Qd is connected to the switching transistor Qs, the input terminal of the driving transistor Qd is connected to the corresponding driving voltage line 172, and the output terminal of the driving transistor Qd is connected to the organic light emitting element OLED. The driving transistor Qd flows an output current Id, intensity of which is changed based on a voltage between the control terminal and the output terminal thereof.

The capacitor Cst is connected between the control terminal and the input terminal of the driving transistor Qd. The capacitor Cst charges a data signal applied to the control terminal of the driving transistor Qd and maintains the charged data signal even after the switching transistor Qs is turned off.

The organic light emitting element OLED includes an anode connected to the output terminal of the driving transistor Qd and a cathode connected to a common voltage Vss. The organic light emitting element OLED displays an image by changing intensity thereof based on the output current Id of the driving transistor Qd. The organic light emitting element OLED may include an organic emission layer which emits any one or one or more light of primary colors such as three primary colors of red, green and blue, and displays a predetermined image in a spatial combination of the colors.

In an exemplary embodiment, the switching transistor Qs and the driving transistor Qd are n-channel field effect transistors ("FET"s), but is not limited thereto. In an alternative exemplary embodiment, at least one of the switching transistor Qs and the driving transistor Qd may be a p-channel FET. In an alternative exemplary embodiment, the connections among the transistors Qs and Qd, the capacitor Cst and the organic light emitting diode OLED is not limited to the structure shown in FIG. 3, but may be variously modified.

Next, an exemplary embodiment of a method of manufacturing an OLED display according to the invention will be described with reference to FIGS. 4 to 6.

Figure 4:
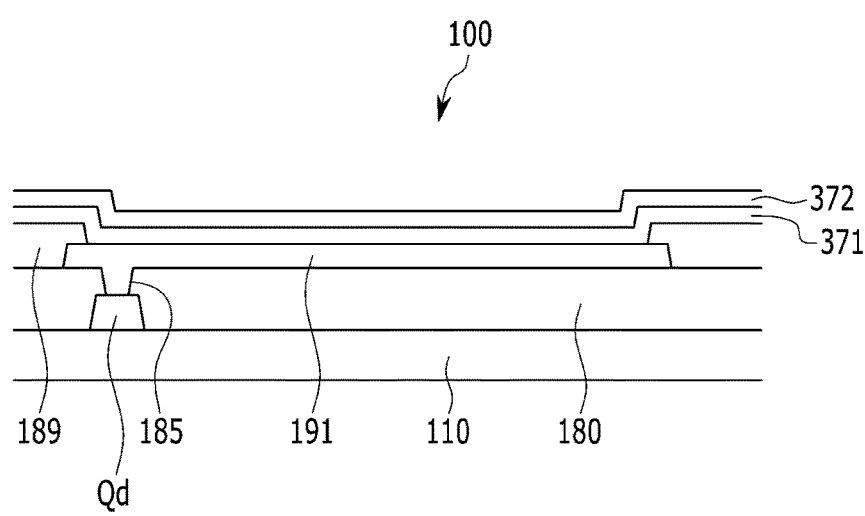
FIG. 4 is a cross-sectional view of a substrate before depositing an organic emission layer of an exemplary embodiment of an OLED display according to the invention.
Figure 5:
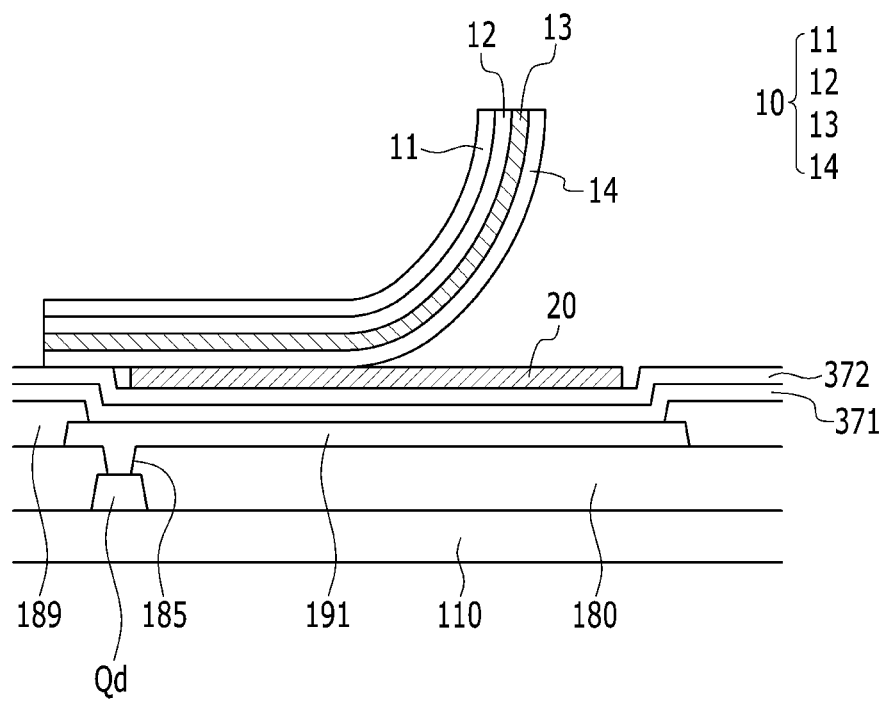
FIGS. 5 and 6 are views showing a process of transferring a transfer layer of a donor substrate to a substrate in an exemplary embodiment of a manufacturing method of an OLED display according to the invention.
Figure 6:
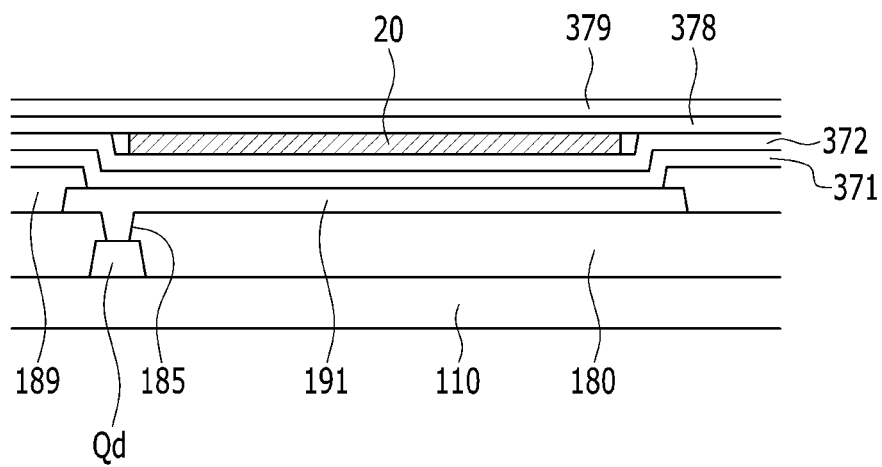

FIG. 4 is a cross-sectional view of a substrate before depositing an organic emission layer 20 of an exemplary embodiment of an OLED display according to the invention, and FIGS. 5 and 6 are views showing a process of transferring an organic emission layer 20 of a donor substrate 10 to a substrate in an exemplary embodiment of a manufacturing method of an OLED display according to the invention.

Firstly, referring to FIG. 4, the driving transistor Qd is provided on an insulation substrate 110, and a protective layer 180, in which a contact hole 185 is formed, is provided on the insulation substrate 110. In such an embodiment, the contact hole 185 is positioned on the driving transistor Qd such that driving transistor Qd is exposed.

Next, a conductive oxide member is deposited and patterned on the protective layer 180 in a region corresponding to a pixel to provide a pixel electrode 191. In an exemplary embodiment, a reflection layer (not shown) may be further deposited and provided between the protective layer 180 and the pixel electrode 191 of the pixel. In such an embodiment, a pixel definition layer 189 is provided on the protective layer 180 to cover a portion of the pixel electrode 191.

Next, a hole injection layer ("HIL") 371 and a hole transport layer ("HTL") 372 are sequentially provided, e.g., deposited, on the pixel electrode 191. In an exemplary embodiment, the HIL 371 and the HTL collectively define a hole auxiliary layer.

Next, referring to FIG. 5, the donor substrate 10 is prepared. In an exemplary embodiment, the donor substrate 10 may be prepared by sequentially depositing the base layer 11, the primer layer 12, the light-to-heat conversion layer ("LTHC") 13 and the intermediate layer 14 on one another. In such an embodiment, the donor substrate 10 may be prepared by providing the primer layer on the base layer 11, providing the light-to-heat conversion layer 13 on the primer layer 12, and providing the intermediate layer 14 on the light-to-heat conversion layer 13. In such an embodiment, the light-to-heat conversion layer 13 includes graphene.

In such an embodiment, the graphene may include a graphene sheet or graphene pieces dispersed in the dispersion material.

In an exemplary embodiment, where the light-to-heat conversion layer 13 includes the graphene sheet, the graphene of the sheet shape may be manufactured to have a single layer structure or a multi-layer structure through the CVD process. In such an embodiment, the entire surface of the donor film may be substantially uniform.

In an exemplary embodiment, where the light-to-heat conversion layer 13 includes the graphene pieces dispersed to the dispersion material, the graphene pieces may be prepared by weakening r removing a combination between graphite layers using a method of oxidizing graphite to form an oxidized graphene pieces, and reducing the oxidized graphene pieces using a reduction method. The light-to-heat conversion layer 13 may be provided by dispersing the graphene pieces into the dispersion material. In such an embodiment, the dispersion material may be one of tetrahydrofuran and dichlorobenzene, but is not limited thereto.

The graphene pieces are easily dispersed in the dispersion material such that a transparent graphene film may be provided.

In an exemplary embodiment, the light-to-heat conversion layer 13 is provided by dispersing the graphene pieces to the dispersion material or applying the graphene sheet, such that light transmittance of the donor substrate 10 may be substantially high, and the alignment of the transfer pattern is thereby substantially effectively and efficiently performed in the laser transfer process.

In such an embodiment, as described above, the light-to-heat conversion layer 13 of the donor substrate 10 including the graphene may have a substantially uniform structure compared to a conventional donor substrate including the carbon black, such that stability of the laser transfer process may be improved, and a defect of the OLED display may be prevented.

The donor substrate 10 including the organic emission layer 20 is disposed on the HTL 372 of the insulation substrate 110 provided on the pixel electrode 191.

Next, the HTL 372 is disposed directly to the organic emission layer 20 of the donor film 10 such that the HTL 372 is substantially uniformly in contact with the organic emission layer 20 of the donor film 10, and the laser is irradiated to a portion of the donor substrate 10 contacting the HTL 372 to transfer the organic emission layer 20 of the donor substrate 10 on the insulation substrate 110. Accordingly, the organic emission layer 20 is provided on the HTL 372 disposed on the insulation substrate 110.

As described above, in the laser transfer process using the donor substrate 10 according to an exemplary embodiment of the invention, the light transmittance of the donor film 10 may be obtained such that the alignment of the transfer pattern may be easily obtained and the quality defect of the OLED display such as transfer non-uniformity and surface stains may be prevented by the uniform donor film 10.

Next, as shown in FIG. 6, an electron transport layer ("ETL") 378, an electron injection layer ("EIL") 379 and the common electrode (not shown) may be sequentially provided, e.g., deposited, on the organic emission layer 20, and then an encapsulation layer (not shown) is provided thereon to complete the OLED display. In such an embodiment, the ETL and the EIL collectively define an electron auxiliary layer.

In exemplary embodiments, as described above, the donor substrate has high light transmittance such that the alignment of the transfer patterns may be easily performed in the laser transfer process. In such embodiments, as described above, the light-to-heat conversion layer 13 of the donor substrate 10 including the graphene may have a substantially uniform structure compared to a conventional donor substrate including the carbon black, such that stability of the laser transfer process may be improved, and a defect of the OLED display may be prevented.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A donor substrate for a laser transfer comprising:
   a base layer;
   a primer layer disposed on the base layer;
   a light-to-heat conversion layer disposed on the primer layer; and
   an intermediate layer disposed on the light-to-heat conversion layer,
   wherein the light-to-heat conversion layer comprises a light-to-heat conversion material and thermosetting resin, and wherein the light-to-heat conversion material comprises graphene, and wherein the thermosetting resin comprises a polyurethane having a glass transition temperature between 10 to 50° C.;
   wherein the light-to-heat conversion material is in a range of about 25 wt % to about 40 wt % based on a total weight of the light-to-heat conversion layer.

2. The donor substrate for the laser transfer of claim 1, wherein
   light transmittance of the base layer is greater than about 90%.

3. The donor substrate for the laser transfer of claim 2, wherein
   the base layer comprises glass, a transparent film or a polymer film.

4. The donor substrate for the laser transfer of claim 2, wherein
   a thickness of the base layer is in a range of about 0.025 millimeter to about 0.15 millimeter.

5. The donor substrate of claim 1, wherein
   the graphene of the light-to-heat conversion material comprises a graphene sheet.

6. The donor substrate of claim 1, wherein
   the graphene of the light-to-heat conversion material comprises a plurality of graphene pieces, and
   the light-to-heat conversion layer further comprises a dispersion material in which the graphene pieces are dispersed.

7. The donor substrate of claim 6, wherein
   the dispersion material comprises tetrahydrofuran or dichlorobenzene.

8. The donor substrate of claim 1, wherein
   a thickness of the intermediate layer is in a range of about 1.0 micrometer to about 3.0 micrometers.

* * * * *